(12) United States Patent
Zhao et al.

(10) Patent No.: US 12,167,671 B2
(45) Date of Patent: Dec. 10, 2024

(54) FLEXIBLE DISPLAY SUBSTRATE AND METHOD FOR PREPARING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jincan Zhao, Beijing (CN); Sheng Yang, Beijing (CN); Yiming Wang, Beijing (CN); Yan Cui, Beijing (CN); Jie Zhou, Beijing (CN); Zhijun Huang, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 423 days.

(21) Appl. No.: 17/569,158

(22) Filed: Jan. 5, 2022

(65) Prior Publication Data
US 2022/0285636 A1    Sep. 8, 2022

(30) Foreign Application Priority Data

Mar. 8, 2021    (CN) .......................... 202110252157.3

(51) Int. Cl.
*H10K 77/10*    (2023.01)
*H10K 59/12*    (2023.01)
*H10K 71/00*    (2023.01)
*H10K 102/00*   (2023.01)

(52) U.S. Cl.
CPC .......... *H10K 77/111* (2023.02); *H10K 59/12* (2023.02); *H10K 71/00* (2023.02); *H10K 2102/311* (2023.02)

(58) Field of Classification Search
CPC ............. H10K 71/80; H10K 2102/311; H10K 77/111; H10K 59/873; H10K 59/8731; H01L 2221/68318
See application file for complete search history.

(56) References Cited

U.S. PATENT DOCUMENTS

| | | | |
|---|---|---|---|
| 2018/0081756 A1* | 3/2018 | Akasawa | G06F 11/1004 |
| 2019/0207130 A1* | 7/2019 | He | H10K 71/80 |
| 2020/0411803 A1* | 12/2020 | Kishimoto | H10K 71/80 |

FOREIGN PATENT DOCUMENTS

CN    108539051 A    9/2018

\* cited by examiner

*Primary Examiner* — Walter H Swanson
*Assistant Examiner* — Moataz Khalifa
(74) *Attorney, Agent, or Firm* — IPro, PLLC

(57) ABSTRACT

A method for preparing a flexible display substrate is provided. The method includes: forming an isolating protective film layer on a rigid substrate; forming a flexible base on the isolating protective film layer; forming a functional layer on the flexible base; and stripping the rigid substrate to form the flexible display substrate.

15 Claims, 6 Drawing Sheets

FLEXIBLE DISPLAY SUBSTRATE AND METHOD FOR PREPARING SAME, AND DISPLAY DEVICE

CROSS-REFERENCE TO RELATED APPLICATION

This application claims priority to Chinese Patent Application No. 202110252157.3, filed Mar. 8, 2021, and entitled "FLEXIBLE DISPLAY SUBSTRATE AND METHOD FOR PREPARING SAME, AND DISPLAY DEVICE", the disclosure of which is incorporated herein by reference in its entirety.

TECHNICAL FIELD

The present disclosure relates to the field of display technologies, and more particularly relates to a flexible display substrate and a method for preparing the same, and a display device.

BACKGROUND

Compared with liquid crystal displays (LCDs), organic electroluminescence displays (OLEDs) have advantages such as self-illumination, lightness and thinness, wide viewing angle, high brightness, high contrast, low drive voltage, and fast response, and thus are considered as the next generation display technology.

SUMMARY

The present disclosure provides a flexible display substrate and a method for preparing the same, and a display device.

In an aspect, the present disclosure provides a method for preparing a flexible display substrate. The method includes: forming an isolating protective film layer on a rigid substrate; forming a flexible base on the isolating protective film layer; forming a functional layer on the flexible base; and stripping the rigid substrate to form the flexible display substrate.

In some embodiments, forming the functional layer on the flexible base includes: forming the functional layer on the flexible base through evaporation, wherein an orthographic projection of an evaporation shadow region on the rigid substrate is within an orthographic projection of the isolating protective film layer on the rigid substrate.

In some embodiments, after forming the functional layer on the flexible base, the method further includes: forming a first protective film layer on the functional layer.

In some embodiments, an area of an orthographic projection of the first protective film layer on the rigid substrate is larger than an area of an orthographic projection of the functional layer on the rigid substrate.

In some embodiments, an area of an orthographic projection of the first protective film layer on the rigid substrate is larger than an area of an orthographic projection of the isolating protective film layer on the rigid substrate.

In some embodiments, forming the isolating protective film layer on the rigid substrate includes: forming an organic resin solution on the rigid substrate; and curing the organic resin solution to form the isolating protective film layer.

In some embodiments, the organic resin solution is formed on the rigid substrate by at least one of: spray coating, spin coating, or blade coating.

In another aspect, the present disclosure provides a flexible display substrate. The flexible display substrate includes: an isolating protective film layer; a flexible base, disposed on a side of the isolating protective film layer; and a functional layer, disposed on a side of the flexible base distal from the isolating protective film layer.

In some embodiments, the flexible display substrate further includes: a rigid substrate, wherein the isolating protective film layer is disposed on a side of the rigid substrate.

In some embodiments, an orthographic projection of the functional layer on the rigid substrate is within an orthographic projection of the isolating protective film layer on the rigid substrate.

In some embodiments, the flexible display substrate further includes: a first protective film layer, disposed on a side of the functional layer distal from the flexible base.

In some embodiments, an area of an orthographic projection of the first protective film layer on the rigid substrate is larger than an area of an orthographic projection of the functional layer on the rigid substrate.

In some embodiments, an area of an orthographic projection area of the first protective film layer on the rigid substrate is greater than an orthographic projection of the isolating protective film layer on the rigid substrate.

In some embodiments, the isolating protective film layer includes an organic resin film layer.

In some embodiments, the functional layer includes: a gate layer, a source/drain layer, an anode layer, a gate insulating layer, an interlayer dielectric layer, a planarization layer, a pixel defining layer, a photo spacer layer, and a light emitting layer.

In still another aspect, the present disclosure provides a display device. The display device includes: a flexible display substrate, wherein the flexible display substrate includes: an isolating protective film layer; a flexible base, disposed on a side of the isolating protective film layer; and a functional layer, disposed on a side of the flexible base distal from the isolating protective film layer.

DETAILED DESCRIPTION

To make the objectives, technical solutions, and advantages of the present disclosure clearer, the present disclosure is described below in combination with the specific embodiments and with reference to the accompanying drawings.

It should be noted that unless otherwise defined, technical or scientific terms used in the embodiments of the present disclosure shall have ordinary meaning understood by persons of ordinary skill in the art to which the disclosure belongs. The terms "comprise, comprises and comprising" or "include, includes and including" and the like are used to indicate that the element or object preceding the term covers the element or object following the term and its equivalents, and shall not be understood as excluding other elements or objects. The terms "connect to" or "connect with" and the like are not intended to be limited to physical or mechanical connections, but may include electrical connections, either direct or indirect connection. "Upper", "lower", "left", "right" and the like are merely intended to denote relative positional relationships, which may also be changed accordingly when the absolute position of the object described is changed.

Figure 1:
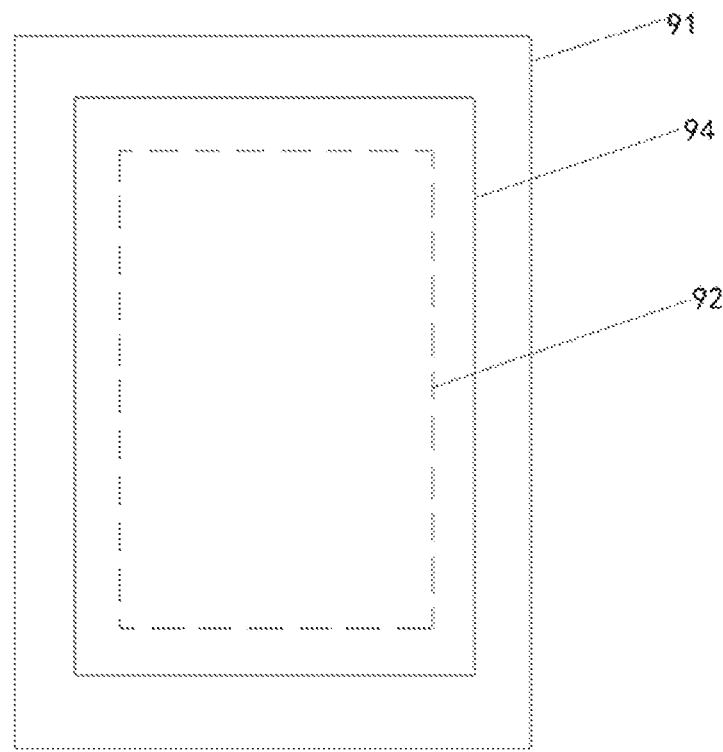
FIG. 1 is a top view of a flexible display substrate in the related art.
Figure 2A:
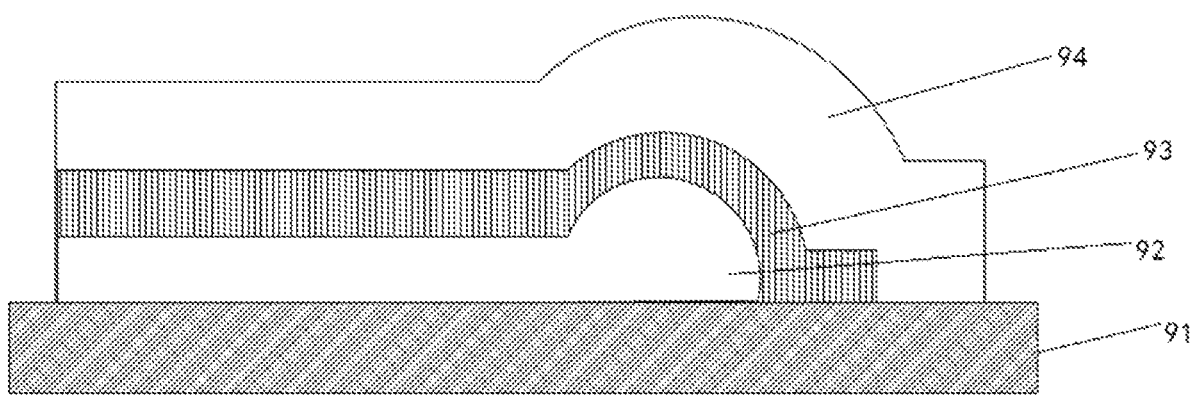
FIG. 2a is a schematic structural diagram of a flexible display substrate before a glass substrate is stripped in the related art.

FIG. 1 is a top view of a flexible display substrate in the related art; FIG. 2a is a schematic structural diagram of a flexible display substrate before a glass substrate is stripped in the related art; and FIG. 2b is a schematic structural diagram of a flexible display substrate after a glass substrate is stripped in the related art.

Figure 2B:
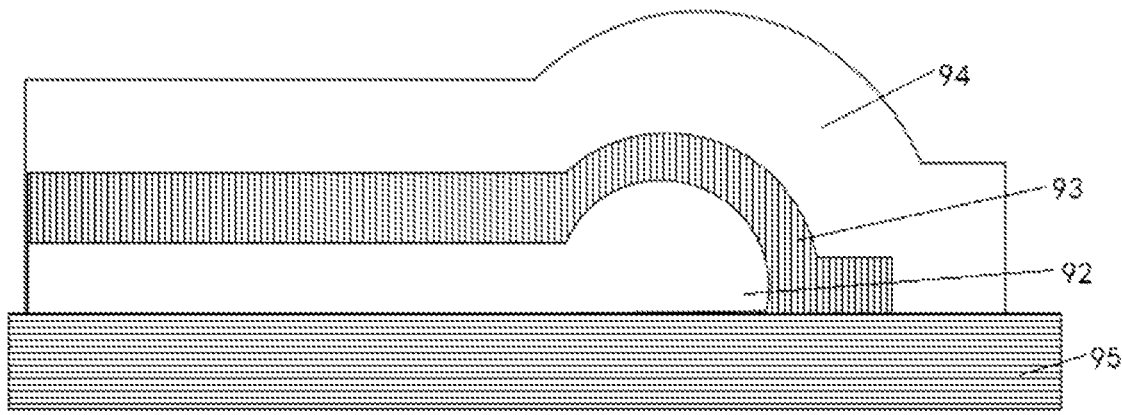
FIG. 2b is a schematic structural diagram of a flexible display substrate after a glass substrate is stripped in the related art.

Referring to FIGS. 1, 2a and 2b, when an organic electroluminescence display product in the related art is prepared, a flexible base of a polyimide (PI) film layer is taken as a first base layer on a glass substrate 91. In the related processes, a second protective film layer 95 needs to be attached on the back side (PI side) of the product after the film forming process of the back plate (BP) and the evaporation package (EVEN) process are completed, because during preparation of the PI film layer 92 and the functional layer 93 on the PI film layer 92, evaporation shadow regions are formed at the edges of the PI film layer 92 and functional layer 93 due to the influence of the evaporation process, that is, the edge of functional layer 93 goes over the edge of the PI film layer 92 and is directly formed on the glass substrate 91, such that the inorganic material in the functional layer 92 remains on the surface of the glass substrate 91 which is in contact with functional layer 92. When a laser lift-off (LLO) process in an even after cutting (EAC) process is adopted subsequently for scanning to strip the glass substrate 91, the inorganic material residues on the surface of the glass substrate 91 may cause abnormality during stripping, and the portion, with the inorganic material residues, of the glass substrate 91 cannot be successfully stripped from the functional layer 93.

Specifically, the LLO process is an important process for stripping the glass substrate 91 during preparation of the flexible display substrate. The LLO process generally includes the followings. The glass substrate 91 is irradiated from the side of the glass substrate 91 distal from the PI film layer 92 by using laser beams emitted by an ultraviolet excimer laser, such that the laser beams pass through the glass substrate 91 and irradiate on the side, in contact with the glass substrate 91, of the PI film layer 92. The side, in contact with the glass substrate 91, of the PI film layer 92 is vaporized, such that the glass substrate 91 is separated from the PI film layer 92, thereby stripping the glass substrate 91. Since the inorganic material in the functional layer 93 remains on the glass substrate 91 when the functional layer 93 is evaporated, the portion, with the inorganic material residues, of the glass substrate 91 cannot be successfully stripped during the LLO process.

A first protective film 94 is disposed on the functional layer 93. After the glass substrate 91 is striped, in order to protect the PI film layer 92 and the functional layer 93, the second protective film layer 95, such as a back film structure made of PET and PSA, needs to be attached on the back side of the stripped surface, i.e., the back side of the OLED product. In process of attaching the back film, foreign materials may remain on the stripped surface of the back film during the LLO process. Meanwhile, as both the OLED product and the back film are flexible products, warping and bubbles may be generated very easily during the attaching process, which easily results in process defects, such as foreign materials, bubbles, warping, and the like. In addition, during preparation of the second protective film layer, a dedicated attaching equipment is required and additional film materials need to be purchased, which results in an increase in costs and a decrease in product competitiveness.

Figure 3:
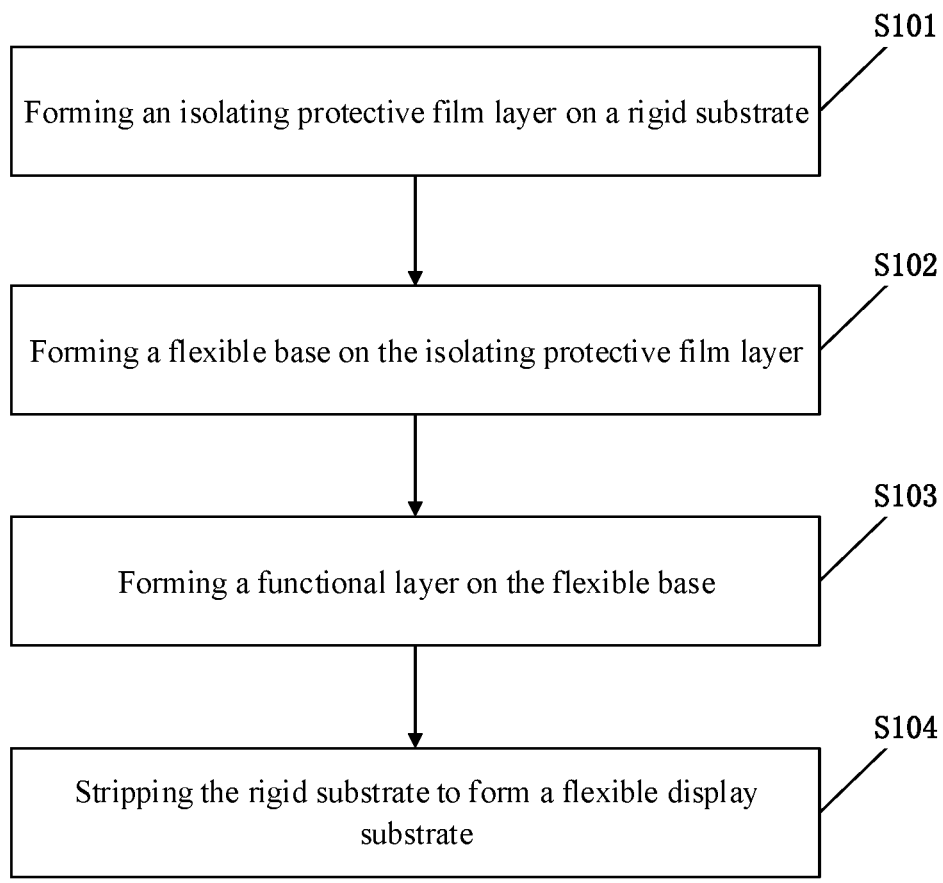
FIG. 3 is a flowchart of a method for preparing a flexible display substrate according to an embodiment of the present disclosure.

An embodiment of the present disclosure provides a method for preparing a flexible display substrate. As shown in FIG. 3, the method for preparing the flexible display substrate includes the following steps.

In step S101, an isolating protective film layer is formed on a rigid substrate.

Figure 5A:
FIG. 5a is a schematic diagram of a rigid substrate according to an embodiment of the present disclosure.

In this embodiment, as shown in FIG. 5a, a rigid substrate 1 is first provided. The rigid substrate 1 may be made of a light-guiding and non-metal transparent material with a certain ruggedness, the rigidity of the rigid substrate 1 is sufficient to carry the isolating protective film layer 2 and the flexible base 3. For example, the rigid substrate 1 may be made of one or more of glass, quartz, or transparent resin.

Figure 5B:
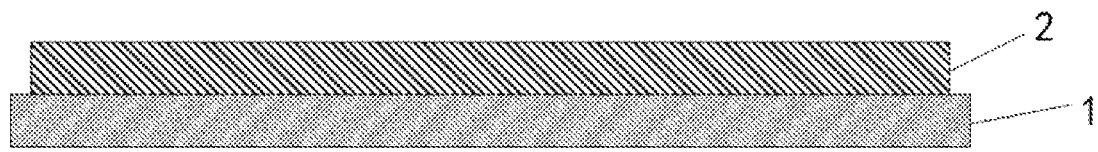
FIG. 5b is a schematic diagram showing formation of an isolating protective film layer according to an embodiment of the present disclosure.

In some embodiments, as shown in FIG. 5b, a polymer solution for forming the isolating protective film layer 2 described above may be formed on the rigid substrate 1 by a coater through spray coating, spin coating, blade coating, or the like, and then the polymer solution is cured to acquire the isolating protective film layer 2.

In step S102, a flexible base is formed on the isolating protective film layer.

In this embodiment, the flexible base may be of a single-layered structure or a multi-layered structure. For example, the flexible base may be a single-layered organic layer, or the flexible base may be of a multi-layered structure in which organic layers and inorganic layers are alternately laminated. The organic layer may be made of an organic transparent material. For example, the organic layer may be made of one or more of PI, polyethylene naphthalate two formic acid glycol ester (PEN), polyethylene terephthalate (PET), polyarylate (PAR), polycarbonate (PC), polyether sulfone (PES), or polyetherimide (PEI).

Figure 5C:
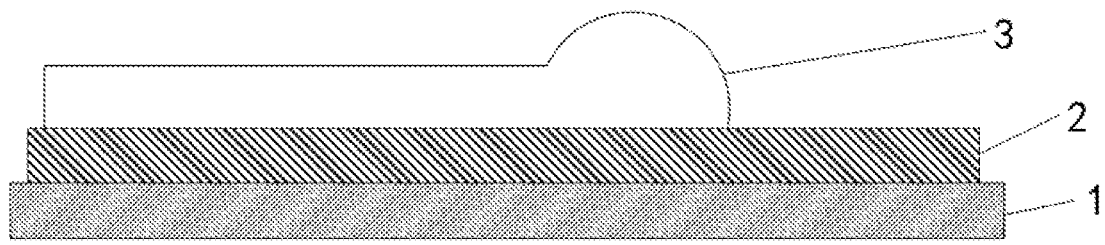
FIG. 5c is a schematic diagram showing formation of a flexible base according to an embodiment of the present disclosure.

In some embodiments, as shown in FIG. 5c, the polymer solution for forming the flexible base 3 described above may be formed on the isolating protective film layer 2 by a coater through spray coating, spin coating, blade coating, or the like, and then the polymer solution is cured to acquire the flexible base 3.

In some embodiments, by taking an example in which the flexible base 3 is made of PI, a layer of PI solution may be coated on the isolating protective film layer 2, and then the coated PI solution may be dried to acquire the flexible base 3.

Figure 7A:
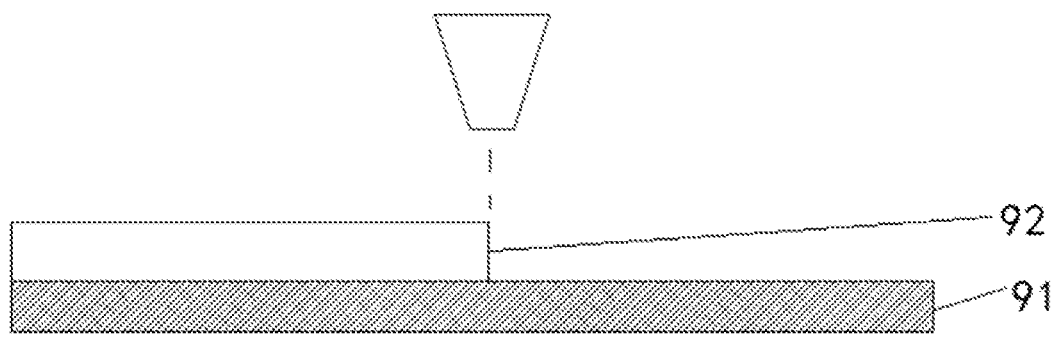
FIG. 7a is a schematic diagram showing coating of a flexible base in the related art.
Figure 7B:
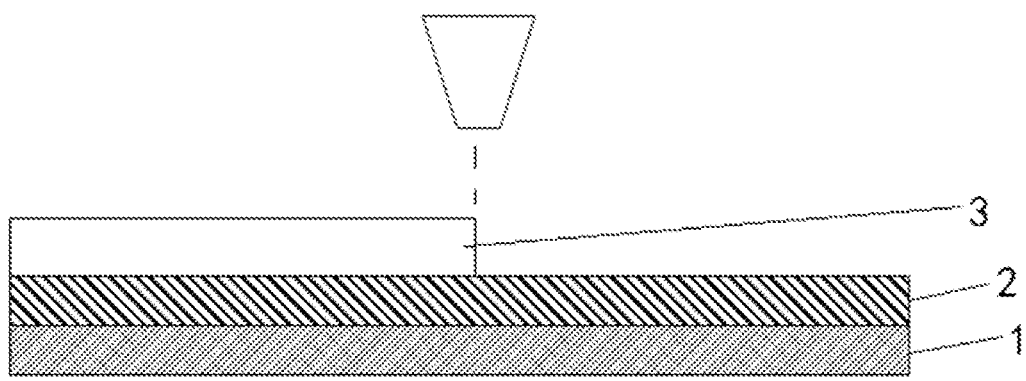
FIG. 7b is a schematic diagram showing coating of a flexible base according to an embodiment of the present disclosure.

FIG. 7a is a schematic diagram showing coating of a flexible base in the related art; and FIG. 7b is a schematic diagram showing coating of a flexible base according to an embodiment of the present disclosure. The preparation process of the flexible base 3 is similar to the preparation process of the isolating protective film layer 2, in both of which the polymer solution is coated through spraying coating, spin coating, blade coating, or the like, and then the coated polymer solution is cured to form the corresponding film layers. Therefore, when the flexible display substrate is prepared by using the flexible base in the related art, the coating equipment adopted in the related art can be adopted to prepare the isolating protective film layer, without the need to purchase additional equipment and film materials, which reduces the investment in the attaching equipment and film materials in the EAC process, thereby reducing the costs.

In step S103, a functional layer is formed on the flexible base.

Optionally, in this embodiment, the functional layer 4 includes various film layers, including a gate layer, a source/drain (SD) layer, an anode layer, a gate insulating (GI) layer, an interlayer dielectric (ILD) layer, a planarization (PLN) layer, a pixel defining layer (PDL), a photo spacer (PS) layer, a light emitting layer, or the like in the flexible display substrate.

Specifically, the functional layer 4 may be formed on the flexible base 3 through evaporation. The orthographic projection of the evaporation shadow region on the rigid substrate 1 is within the orthographic projection of the isolating protective film layer 2 on the rigid substrate 1.

Figure 5D:
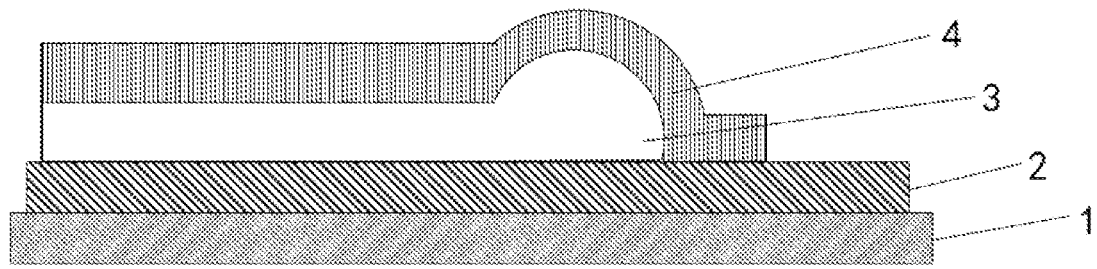
FIG. 5d is a schematic diagram showing formation of a functional layer according to an embodiment of the present disclosure.

In this embodiment, when evaporation is performed on the functional layer 4, an evaporation mask is used for shielding, and the evaporation material is evaporated from an opening in the evaporation mask onto the location of the corresponding pixel. As point source evaporation and linear source evaporation are adopted, relative movement occurs between the evaporation source and the base, which results in an evaporation shadow region on the mask subsequently. As shown in FIG. 2a, in the related art, for the functional layer 93 in the edge region of the flexible base 92, due to the evaporation shadow region, the material of the functional layer 93 goes over the edge of the flexible base 92 and is directly formed on the rigid substrate 91, such that the inorganic material in the functional layer 93 remains in the rigid substrate 91 that is in contact with the functional layer 93, which results in abnormality in stripping of the rigid substrate 91 subsequently. In the present disclosure, as shown in FIG. 5d, an isolating protective film layer 2 is formed on the rigid substrate 1 before the flexible base 3 is formed, to prevent the inorganic material in the functional layer 4 from remaining in the rigid substrate 1 during evaporation of the function layer 4, thereby avoiding the abnormality in stripping of the rigid substrate 1 subsequently. In addition, when the rigid substrate 1 is stripped, the isolating protective film layer 2 remains on the flexible base 3 and plays a protective function, without the need to additionally attaching the second protective film layer, which not only avoids the process defects, such as foreign materials, bubbles, warping, and the like caused by attaching the second protective film layer, but also reduces the process and material costs, thereby improving the product competitiveness.

Figure 5E:
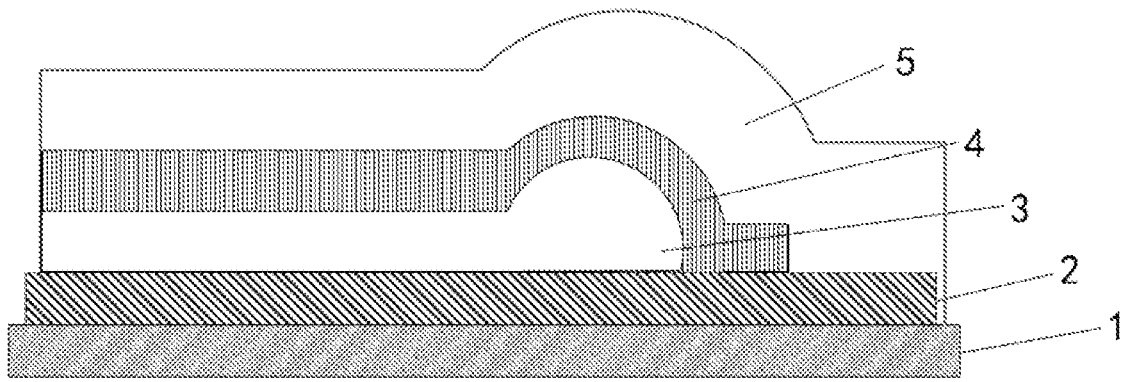
FIG. 5e is a schematic diagram showing formation of a first protective film layer according to an embodiment of the present disclosure.
Figure 5F:
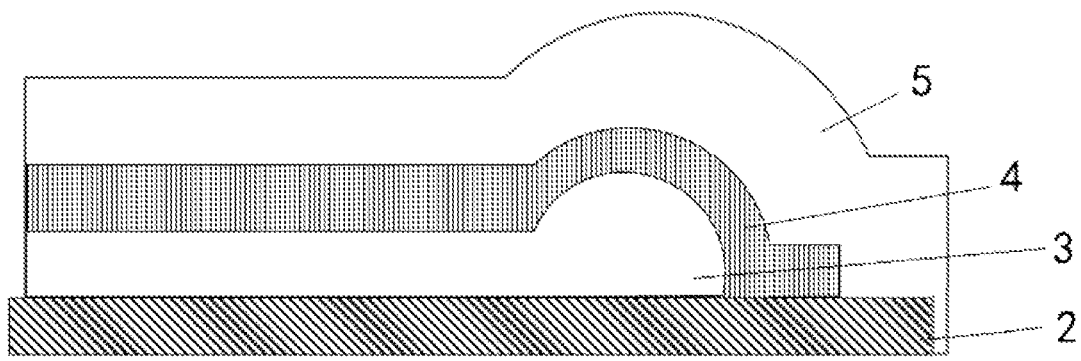
FIG. 5f is a schematic structural diagram of a flexible display substrate after stripping a rigid substrate according to an embodiment of the present disclosure.

In step S104, as shown in FIG. 5f, the rigid substrate is stripped to form a flexible display substrate.

Optionally, in this embodiment, the rigid substrate 1 may be stripped through the LLO process. In this embodiment, the rigid substrate 1 is irradiated from the side of the rigid substrate 1 distal from the isolating protective film layer 2 by laser beams emitted by an ultraviolet excimer laser, such that the laser beams pass through the rigid substrate 1, and irradiate on the side, in contact with the rigid substrate 1, of the isolating protective film layer 2, and reacts with the side, in contact with the rigid substrate 1, of the isolating protective film layer 2. The side, in contact with the rigid substrate 1, of the isolating protective film layer 2 is vaporized, such that the rigid substrate 1 is separated from the isolating protective film layer 2, thereby stripping the rigid substrate 1. During stripping of the rigid substrate 1, since the isolating protective film layer 2 completely isolates the functional layer 4 from the rigid substrate 1, no organic material in the functional layer remains in the rigid substrate 1, and thus no abnormality in stripping occurs.

According to the method for preparing the flexible display substrate in the present embodiment, an isolating protective film layer is first formed on the rigid substrate before the flexible base is formed on the rigid substrate. In this way, after the rigid substrate is stripped, the isolating protective film layer is still attached to the flexible base and plays a protective function, without the need to additionally attaching the second protective film layer, which avoids the process defects, such as foreign materials, bubbles, warping, and the like caused by attaching the second protective film layer, and reduces the process steps and costs. In addition, the isolating protective film layer can prevent the inorganic material from remaining in the rigid substrate during evaporation of the functional layer, thereby avoiding abnormality in separation subsequently. As the preparation process of the isolating protective film layer is similar to the preparation process of the flexible base, the equipment adopted to prepare the flexible base can be adopted to prepare the isolating protective film layer, without the need to additionally provide the dedicated equipment for attaching the second protective film layer. Thus, the costs are saved.

In some optional embodiments of the present disclosure, as shown in FIG. 5e, when the functional layer 4 is formed, the orthographic projection of the evaporation shadow region on the rigid substrate 1 is within the orthographic projection of isolating protective film layer 2 on the rigid substrate 1, such that the area of the orthographic projection of the isolating protective film layer 2 on the rigid substrate 1 is larger than the area of the orthographic projection of the evaporation shadow region of the functional layer 4 on the rigid substrate 1.

In the related art, due to the evaporation shadow region, the material of the functional layer 4 goes over the edge of the flexible base 3, and is directly formed on the rigid substrate 1, which results in that the inorganic material in the functional layer 4 remains at the position, in contact with functional layer 4, of the rigid substrate 1. When the rigid substrate 1 is stripped in subsequent process steps, due to the residues of the inorganic material in the rigid substrate 1, the portion, with the residues of the inorganic material, of the rigid substrate 1 cannot be well separated from functional layer 4, which results in separation abnormality. In the present embodiment, as the isolating protective film layer 2 is provided, the area, covered by the isolating protective film layer 2, of the rigid substrate 1 is larger than the area of the evaporation shadow region of the functional layer 4, such that the isolating protective film layer 2 completely isolates the functional layer 4 from the rigid substrate 1. When the functional layer 4 is evaporated, the inorganic material in the functional layer 4 does not remain on the rigid substrate 1, and thus no separation abnormality occurs.

Optionally, as shown in FIG. 5e, after the functional layer 4 is formed on the flexible base in step S103, the method further includes: forming a first protective film layer 5 on the functional layer 4. In this embodiment, the first protective film layer 5 is attached on the functional layer 4 through an attaching process, to protect the film structures in the flexible display substrate.

Figure 4:
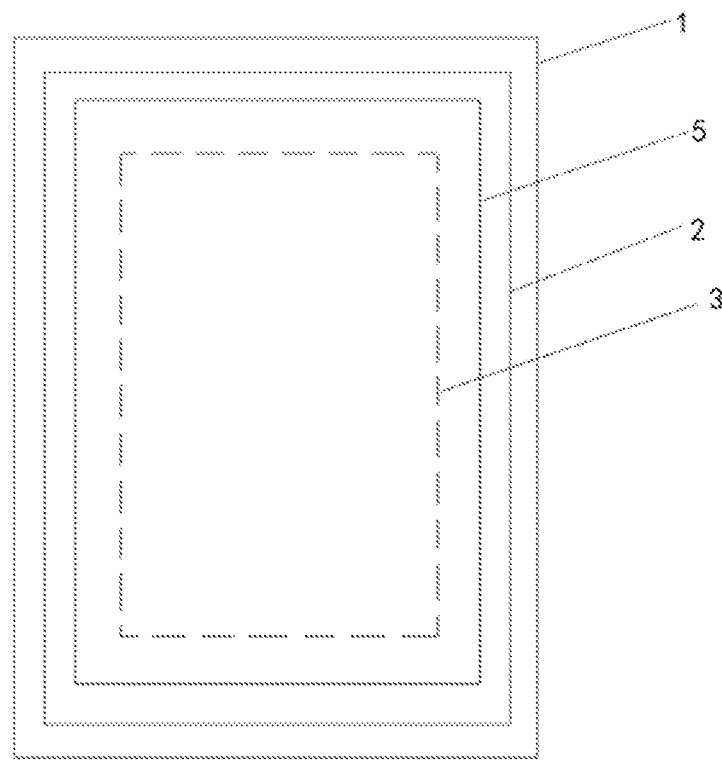
FIG. 4 is a top view of a flexible display substrate according to an embodiment of the present disclosure.

In some optional embodiments of the present disclosure, as shown in FIGS. 4 and 5e, the area of the orthographic projection of the first protective film layer 5 on the rigid substrate 1 is larger than the area of the orthographic projection of the functional layer 4 on the rigid substrate 1, so that the first protective film layer 5 can better protect the functional layer 4. The area of the orthographic projection of the first protective film layer 5 on the rigid substrate 1 is larger than the area of the orthographic projection of the isolating protective film layer 2 on the rigid substrate 1, so that when the rigid substrate 1 is stripped by LLO process subsequently, after the isolating protective film layer 2 is separated from the rigid substrate 1, the rigid substrate 1 is not dropped after being flipped over.

In some optional embodiments of the present disclosure, forming the isolating protective film layer on the rigid substrate in step S101 includes coating organic resin on the rigid substrate to form the isolating protective film layer.

In this embodiment, an organic resin solution may be formed on the rigid substrate through spray coating, spin coating, blade coating, or the like, and then the organic resin solution is cured to acquire the isolating protective film layer.

Here, the organic resin may be organic silicon resin, including polyalkylsiloxane resin, polyarylsiloxane resin, and polyalkylarylsiloxane resin, and the like. For example, the organic silicon resin may include silicone rubber, and the like.

Figure 6:
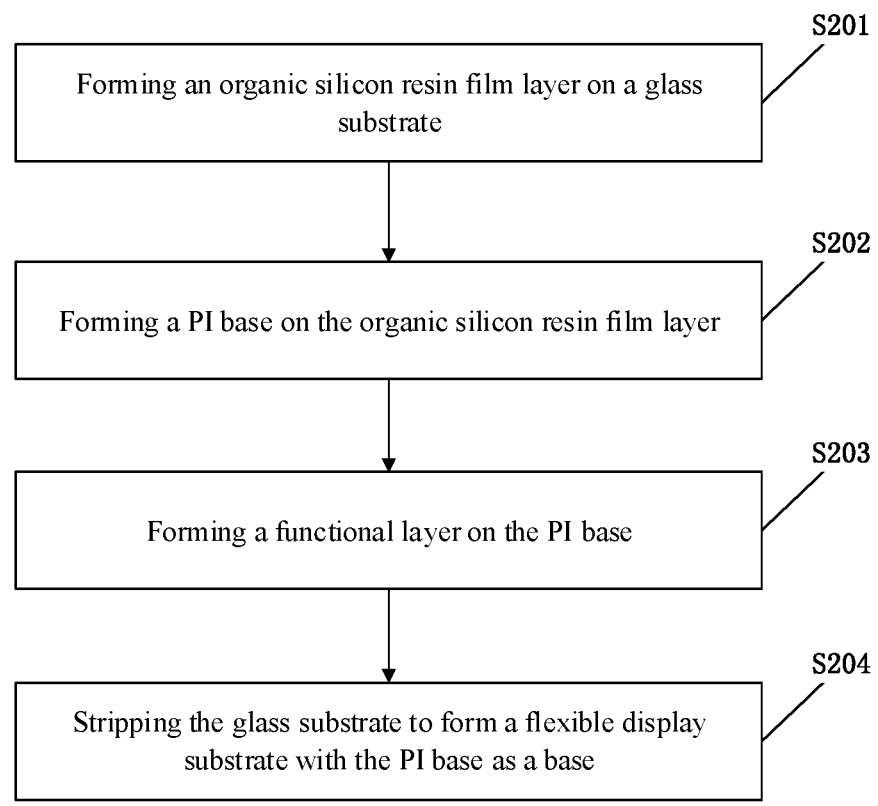
FIG. 6 is another flowchart of a method for preparing a flexible display substrate according to an embodiment of the present disclosure.

The technical solutions of the present disclosure are described in further detail by taking an example in which the rigid substrate 1 is a glass substrate, the flexible base 3 is a PI base, the isolating protective film layer 2 is an organic silicon resin film layer. As shown in FIG. 6, the method for preparing the flexible display substrate includes the following steps.

In step S201, an organic silicon resin film layer is formed on a glass substrate.

In this embodiment, a layer of organic silicon resin solution is coated on the glass substrate through spray coating, spin coating, blade coating, or the like, and then the coated organic silicon resin solution is dried to acquire the organic silicon resin film layer. The area of the orthographic projection of the organic silicon resin film layer on the glass substrate is smaller than the area of the glass substrate.

In step S202, a PI base is formed on the organic silicon resin film layer.

In this embodiment, the PI base is formed in a manner similar to that of forming the organic silicon resin film layer. That is, a layer of PI solution is coated on the organic silicon resin film layer through spray coating, spin coating, blade coating, or the like, and then the coated PI solution is dried to acquire the PI base. The area of the orthographic projection of the PI base on the glass substrate is smaller than the area of the orthographic projection of the organic silicon resin film layer on the glass substrate.

In step S203, a functional layer is formed on the PI base.

In this embodiment, the film structures in the functional layer are formed on the PI base through evaporation. When the functional layer is formed, the area of the orthographic projection of the evaporation shadow region of the functional layer on the glass substrate is enabled to be smaller than the area of the orthographic projection of the organic silicon resin film layer on the glass substrate, such that the functional layer is completely isolated from the glass substrate by the organic silicon resin film layer. In this way, the inorganic material in the functional layer does not remain on the glass substrate when the functional layer is evaporated, and thus the separation abnormality does not occur when the glass substrate is stripped.

In step S204, the glass substrate is stripped to form a flexible display substrate with the PI base as a base.

In this embodiment, after the glass substrate is stripped through the LLO process, the organic silicon resin film layer still serves as a protective film layer to cover the flexible display substrate, so that flexible cutting can be directly performed on the flexible display substrate after the glass substrate is stripped, without the need to additionally attach the second protective film layer. Thus, the process defects, such as foreign materials, bubbles, warping, and the like caused by attaching the second protective film layer can be avoided. In addition, there is no need to additionally purchase the dedicated equipment for attaching the second protective film layer and the material of the second protective film layer. Thus, the process steps are reduced, and the costs in device and materials are saved.

The order of the steps in the method for preparing the flexible display substrate provided by the embodiments of the present disclosure may be appropriately adjusted, and the steps may also be removed or added accordingly. Within the technical scope disclosed by the present disclosure, any variations of the method readily derived by persons skilled in the art shall be included in the protection scope of the present disclosure, and details are not repeated herein.

An embodiment of the present disclosure further provides a flexible display substrate. The flexible display substrate may be prepared by the preparation method described above. As shown in FIG. 5f, the flexible display substrate includes an isolating protective film layer 2, a flexible base 3, and a functional layer 4.

In some examples, the flexible display substrate further includes a rigid substrate 1. The isolating protective film layer 2 is disposed on a side of the rigid substrate 1. The rigid substrate 1 may be stripped after the flexible display substrate is prepared.

The isolating protective film layer 2 is first formed on the rigid substrate 1 before the flexible base 3 is formed. When the isolating protective film layer 2 is prepared, the polymer solution mentioned in step S101 is formed on the rigid substrate 1 through spray coating, spin coating, blade coating, or the like, and then the polymer solution is cured to acquire the isolating protective film layer 2. After the flexible base 3, the functional layer 4 and the like are prepared, the rigid substrate 1 is stripped, and the isolating protective film layer 2 attached to the side, distal from the functional layer 4, of the flexible base 3 is retained for protecting the film layer structures in the flexible display substrate. The isolating protective film layer 2 includes an organic resin film layer, such as a silicon rubber film layer or the like.

The flexible base 3 is disposed on the isolating protective film layer 2. When the flexible base 3 is prepared, the polymer solution mentioned in step S102 is formed on the isolating protective film layer 2 through spray coating, spin coating, blade coating or the like, and then the polymer solution is cured to acquire the flexible base 3. The flexible base 3 may be a PI base.

The functional layer 4 is disposed on the flexible base 3, and the functional layer 4 may include various film layers in the flexible display substrate. For example, the functional layer 4 includes a gate layer, a source/drain (SD) layer, an anode layer, a gate insulating (GI) layer, an interlayer dielectric (ILD) layer, a planarization (PLN) layer, a pixel defining (PDL) layer, a photo spacer (PS) layer, a light emitting layer, or the like. Since the isolating protective film layer 2 is disposed between the rigid substrate 1 and the functional layer 4, when evaporation is performed on the functional layer 4, the inorganic material in the functional layer 4 does not go over the edge of the flexible base 3 and thus does not remain in the rigid substrate 1. Thus, no separation abnormality occurs when the rigid substrate 1 is stripped subsequently. In addition, when the rigid substrate 1 is stripped, the isolating protective film layer 2 remains on the flexible base 3 and plays a protective function. Therefore, there is no need to additionally attach the second protective film layer, which not only avoids the process defects, such as foreign materials, bubbles, warping, and the like caused by attaching the second protective film layer, but also reduces the process and material costs, thereby improving the product competitiveness.

In some optional embodiments, as shown in FIG. 5e, the area of the orthographic projection of the isolating protective film layer 2 on the rigid substrate 1 is larger than the area of the projection of the evaporation shadow region of the functional layer 4 on the rigid substrate 1. Due to the evaporation shadow region, the material of the functional layer 4 goes over the edge of the flexible base 1 to be in contact with the rigid substrate 1, such that the inorganic material in the functional layer 4 remains at the position, in contact with functional layer 4, of the rigid substrate 1. When the rigid substrate 1 is stripped subsequently, due to the residues of the inorganic material in the rigid substrate 1, the portion, with the residues of the inorganic material, of the rigid substrate 1 cannot be well separated from the functional layer 4, resulting in separation abnormality. In the present embodiment, since the isolating protective film layer 2 is provided, and the area, covered by the isolating protective film layer 2, of the rigid substrate 1 is larger than the evaporation shadow area of the functional layer 4, the isolating protective film layer 2 completely isolates the functional layer 4 from the rigid substrate 1. When evaporation is performed on the functional layer 4, the inorganic material in the functional layer 4 does not remain on the rigid substrate 1, and thus no separation abnormality occurs.

Optionally, the flexible display substrate further includes a first protective film layer 5, and the first protective film layer 5 is disposed on the functional layer 4. In this embodiment, the first protective film layer 5 is attached on the functional layer 4 through an attaching process, to protect the film layer structures of the flexible display substrate.

Optionally, the area of the orthographic projection of the first protective film layer 5 on the rigid substrate 1 is larger than the area of the orthographic projection of the functional layer 4 on the rigid substrate 1, so that the first protective film layer 5 can better protect the functional layer 4. The area of the orthographic projection of the first protective film layer 5 on the rigid substrate 1 is larger than the area of the orthographic projection of the isolating protective film layer 2 on the rigid substrate 1.

It should be noted that the detailed descriptions of the structure of the flexible display substrate provided in the embodiments of the present disclosure have been described in the above method embodiments and are not repeated herein.

An embodiment of the present disclosure further provides a display device, including any of the flexible display substrates described above. The display device may be an electroluminescence display device, such as an organic light-emitting display device or a quantum dot light-emitting diodes (QLED) display device. The display device may be any product or component having a display function, such as an electronic paper, a cell phone, a television, a display, a digital photo frame, a navigator, a watch, bracelet, or the like.

It should be understood by persons of ordinary skill in the art that the discussion of any of the embodiments above is exemplary only and is not intended to imply that the scope of the present disclosure (including the claims) is limited to these examples. Under the concept of the present disclosure, the above embodiments or features in different embodiments may also be combined, the steps may be implemented in any order, and there may be many other variations of various aspects of the embodiments of the present disclosure as described above, which are not provided in detail for the sake of brevity.

The embodiments of the present disclosure are intended to include all substitutions, modifications and variations that fall within the broad scope of the appended claims. Therefore, any omissions, modifications, equivalent substitutions, improvements, and the like, which fall within the spirit and principles of the embodiments of the present disclosure, shall be included in the protection scope of the present disclosure.

What is claimed is:

1. A method for preparing a flexible display substrate, comprising:
    forming an isolating protective film layer on a rigid substrate;
    forming a flexible base on the isolating protective film layer;
    forming a functional layer on the flexible base, comprising:
        forming the functional layer on the flexible base through evaporation, wherein an orthographic projection of an evaporation shadow region on the rigid substrate is within an orthographic projection of the isolating protective film layer on the rigid substrate, and material of the functional layer goes over edges of the flexible base to be in contact with the isolating protective film layer; and
    stripping the rigid substrate to form the flexible display substrate.

2. The method of claim 1, wherein forming the isolating protective film layer on the rigid substrate comprises:
    forming an organic resin solution on the rigid substrate; and curing the organic resin solution to form the isolating protective film layer.

3. The method of claim 2, wherein the organic resin solution is formed on the rigid substrate by at least one of: spray coating, spin coating, or blade coating.

4. The method of claim 1, wherein after forming the functional layer on the flexible base, the method further comprises:
forming a first protective film layer on the functional layer.

5. The method of claim 4, wherein an area of an orthographic projection of the first protective film layer on the rigid substrate is larger than an area of an orthographic projection of the functional layer on the rigid substrate.

6. The method of claim 4, wherein an area of an orthographic projection of the first protective film layer on the rigid substrate is larger than an area of an orthographic projection of the isolating protective film layer on the rigid substrate.

7. A flexible display substrate, comprising:
an isolating protective film layer;
a flexible base, disposed on a side of the isolating protective film layer; and
a functional layer, disposed on a side of the flexible base distal from the isolating protective film layer, wherein the functional layer is formed on the flexible base through evaporation, an orthographic projection of an evaporation shadow region on the rigid substrate is within an orthographic projection of the isolating protective film layer on the rigid substrate, and material of the functional layer goes over edges of the flexible base to be in contact with the isolating protective film layer.

8. The flexible display substrate of claim 7, wherein the isolating protective film layer comprise an organic resin film layer.

9. The flexible display substrate of claim 8, wherein the functional layer comprises: a gate layer, a source/drain layer, an anode layer, a gate insulating layer, an interlayer dielectric layer, a planarization layer, a pixel defining layer, a photo spacer layer, and a light emitting layer.

10. The flexible display substrate of claim 7, further comprising:
a rigid substrate, wherein the isolating protective film layer is disposed on a side of the rigid substrate.

11. The flexible display substrate of claim 10, wherein an orthographic projection of the functional layer on the rigid substrate is within an orthographic projection of the isolating protective film layer on the rigid substrate.

12. The flexible display substrate of claim 10, further comprising:
a first protective film layer, disposed on a side of the functional layer distal from the flexible base.

13. The flexible display substrate of claim 12, wherein an area of an orthographic projection of the first protective film layer on the rigid substrate is larger than an area of an orthographic projection of the functional layer on the rigid substrate.

14. The flexible display substrate of claim 12, wherein an area of an orthographic projection area of the first protective film layer on the rigid substrate is greater than an orthographic projection of the isolating protective film layer on the rigid substrate.

15. A display device, comprising: a flexible display substrate, wherein the flexible display substrate comprises:
an isolating protective film layer;
a flexible base, disposed on a side of the isolating protective film layer; and
a functional layer, disposed on a side of the flexible base distal from the isolating protective film layer, wherein the functional layer is formed on the flexible base through evaporation, an orthographic projection of an evaporation shadow region on the rigid substrate is within an orthographic projection of the isolating protective film layer on the rigid substrate, and material of the functional layer goes over edges of the flexible base to be in contact with the isolating protective film layer.

* * * * *